(12) United States Patent
Abbott

(10) Patent No.: US 7,504,716 B2
(45) Date of Patent: Mar. 17, 2009

(54) STRUCTURE AND METHOD OF MOLDED QFN DEVICE SUITABLE FOR MINIATURIZATION, MULTIPLE ROWS AND STACKING

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 340 days.

(21) Appl. No.: 11/259,015

(22) Filed: Oct. 26, 2005

(65) Prior Publication Data

US 2007/0090524 A1    Apr. 26, 2007

(51) Int. Cl.
*H01L 23/02* (2006.01)

(52) U.S. Cl. ...................................... 257/678

(58) Field of Classification Search ................ 438/125; 257/666, 678
See application file for complete search history.

(56) References Cited

U.S. PATENT DOCUMENTS 7,005,327 B2 * 2/2006 Kung et al. ................. 438/125
7,119,421 B2 * 10/2006 Rohrmoser et al. ......... 257/666

* cited by examiner

*Primary Examiner*—Davienne Monbleau
*Assistant Examiner*—Monica D Harrison
(74) *Attorney, Agent, or Firm*—Yingsheng Tung; Wade J. Brady, III; Frederick J. Telecky, Jr.

(57) ABSTRACT

A semiconductor device comprising a semiconductor chip (101) assembled on a first copper cuboid (110); the cuboid has sides of a height (111). The device further has a plurality of second copper cuboids (120) suitable for wire bond attachment; the second cuboids have sides of a height (121) substantially equal to the height of the first cuboid. The back surfaces of all cuboids are aligned in a plane (130). Encapsulation compound (140) is adhering to and embedding the chip, the wire bonds, and the sides of all cuboids so that the compound forms a first surface (140b) aligned with the plane of the back cuboid surfaces and a second surface (140a) above the embedded wires. For devices intended for stacking, the devices further comprise a plurality of vias (160) through the encapsulation compound from the first to the second compound surfaces; the vias are filled with copper, and the via locations are matching between the devices-to-be-stacked.

20 Claims, 5 Drawing Sheets

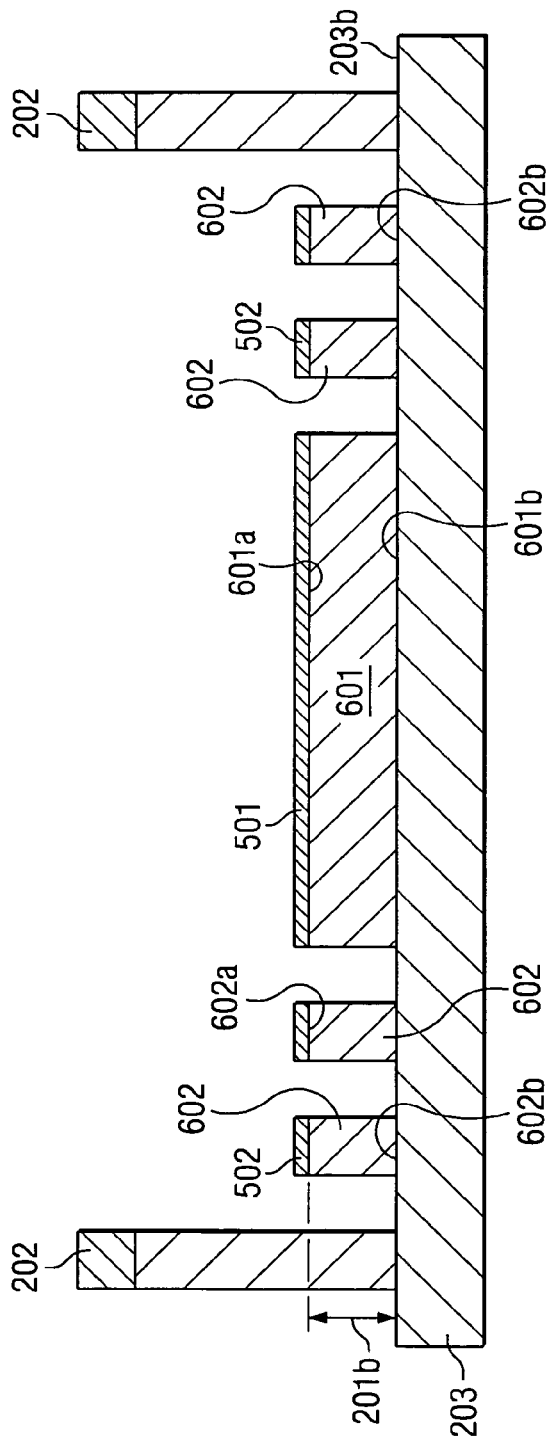
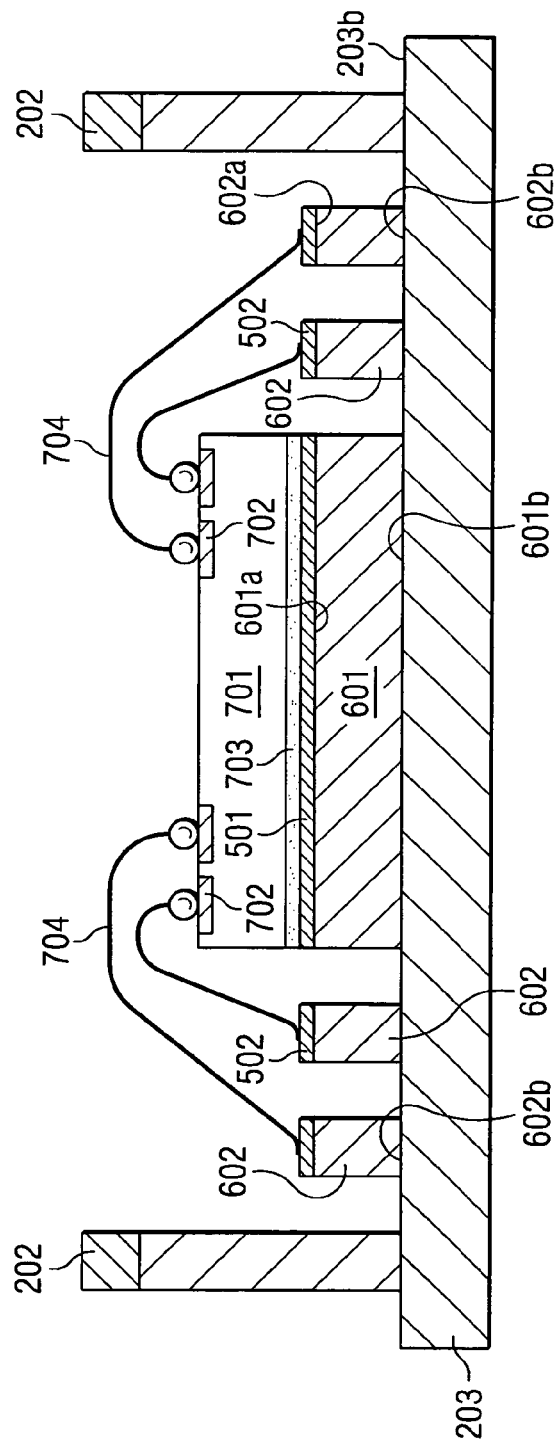

STRUCTURE AND METHOD OF MOLDED QFN DEVICE SUITABLE FOR MINIATURIZATION, MULTIPLE ROWS AND STACKING

FIELD OF THE INVENTION

The present invention is related in general to the field of semiconductor devices and more specifically to low-profile, chip-scale stacked packages and method for fabrication.

DESCRIPTION OF THE RELATED ART

The strong market trend for consumer products such as mobile phones and other portable, hand-held and wearable products demands semiconductor devices as building blocks, which consume only little area and height, when mounted onto circuit boards. One of the most successful approaches for slim, small-size semiconductor devices has been the development of so-called "chip-scale packages". These packages have an outline adding less than 20% to the chip area; however, their height has not yet reached the desired thin profile.

A widely practiced methodology of assembling and enclosing a semiconductor chip begins with providing a "cavity down" package and assembling the chip in the cavity. The assembly process includes the step of attaching the chip with an adhesive material, followed by the step of wire bonding to connect the chip contact pads with the package terminals. In the wire ball-bonding process, however, the mechanically weak heat-affected zone of the wire necessitates the vertical position of the wire over the ball, leading to the hallmark high looping of wire bonding. The cavity-down package itself features frequently several built-in layers of conducting lines in order to enable the solder ball connection to external parts. The height required by the wire looping and the design of the multi-layer package are hindrances for achieving a thin device profile; in addition, they are not amenable to lowering the fabrication cost.

Portable products further require semiconductor devices with improved thermal characteristics, and often with improved electrical performance, especially higher speed. It is difficult in existing cavity-down packages to bring heat-conducting metal pieces into contact with the semiconductor chip. It is also difficult to lay out short, high-speed, or shielded, lines in multi-layer packages, given the technical constraints of wire bonding and multi-layer package construction.

The described technical challenges get even more severe, when the trend towards miniaturization requires packages, which are leadless; in addition, close proximity of chips with different or complementary characteristics my be desirable.

SUMMARY OF THE INVENTION

Applicant recognizes the need for a fresh concept of designing and fabricating low-cost packages, especially for quad-flat-pack, no-lead (QFN) products. It is a technical advantage to have a robust, flexible methodology so that applications for multi-row device contacts and stacked packages can be satisfied. The invention is a new concept of assembling a semiconductor chip without the need for a cavity; further, the interconnecting line lengths can be reduced, one chip surface is freed up for direct heat-spreading attachment, the device profile is reduced, and the costs for the package parts as well as for the whole assembly process are reduced.

One embodiment of the invention is a semiconductor device comprising a semiconductor chip assembled on a first copper cuboid; the cuboid has sides of a height. The device further has a plurality of second copper cuboids suitable for wire bond attachment; the second cuboids have sides of a height substantially equal to the height of the first cuboid. The back surfaces of all cuboids are aligned in a plane. Encapsulation compound is adhering to and embedding the chip, the wire bonds, and the sides of all cuboids so that the compound forms a first surface aligned with the plane of the back cuboid surfaces and a second surface above the embedded wires.

For devices intended for stacking, the devices further comprise a plurality of vias through the encapsulation compound from the first to the second compound surfaces; the vias are filled with copper, and the via locations are matching between the devices-to-be-stacked.

Another embodiment of the invention is a stacked semiconductor device, which consists of two or more devices as described above with matching vias. Solder elements of about equal size are connecting each via metal of the first device with the matching via metals of the second device.

Another embodiment of the invention is a method for fabricating a semiconductor device. First, a copper sheet is provided, which has a first thickness, an aluminum layer on the top surface, and an aluminum layer on the bottom surface. The locations of the top aluminum layer are protected with photoresist, which are determined to evolve into the metal-filled vias of the finished device. The unprotected to aluminum layer is then removed, and the exposed copper layer is also etched to a pre-determined second thickness.

Next, silver is selectively plated to define areas intended for chip attach and wire bond. The copper unprotected by the silver areas is etched, until the bottom aluminum layer is reached. Metal cuboids capped by silver are thus created; the cuboids have sides of the height of a second thickness.

A semiconductor chip is provided, which has a plurality of bond pads. The chip is attached to the respective silver-plated cuboid, and the chip bond pads are connected to the respective silver-plated bond cuboids using bonding wire. The chip, the wire bonds, and the sides of all cuboids are embedded in adhesive encapsulation compound up to the level of the first thickness marked by the aluminum-capped metal vias; the top surface of the device is thus created. Finally, the bottom aluminum layer is removed by etching, whereby the bottom surface of the device is created.

The copper chip pad of the devices made according to the invention can be soldered to a heat sink for excellent thermal device performance. The wire connection can be kept to a minimum, holding electrical resistance and inductance to a small value for high speed performance. The devices can be made so that they will be not much thicker than the thickness of the silicon chip even for multi-row designs.

The devices according to the invention provide many variations. For instance, other metals than copper or copper alloys may be used as starting sheets; an example is aluminum. The metal of the sacrificial layers may also be varied. The adhesion between the encapsulation compound and the metal cuboids may be strengthened by chemical or plasma means. The density of bonding pads or solder lands can be increased without much difficulty. The overall methodology is tolerant for changes in device type or size, without substantial increase in fabrication cost.

The technical advantages represented by certain embodiments of the invention will become apparent from the following description of the preferred embodiments of the inven-

BRIEF DESCRIPTION OF THE DRAWINGS

FIGS. 2 to 9 illustrate schematically significant process steps of the fabrication method of the invention.

FIG. 2 is a schematic cross section through the sheet of starting material including two sacrificial layers.

FIG. 3 depicts a schematic cross section showing the selection of the sites of the future vias and the etching of the first sacrificial layer.

FIG. 4 is a schematic cross section showing the partial etching of the starting material sheet.

FIG. 5 is a schematic cross section illustrating the localized deposition of protective metal layers.

FIG. 6 is a schematic cross section showing the etching of the remainder of the unprotected starting material.

FIG. 7 is a schematic cross section illustrating the assembly of a semiconductor chip in the etched structure.

FIG. 8 is a schematic cross section illustrating the encapsulation of the assembled parts.

FIG. 9 is a schematic cross section showing the removal by etching of the second sacrificial layer.

DETAILED DESCRIPTION OF THE PREFERRED EMBODIMENTS

Figure 1:
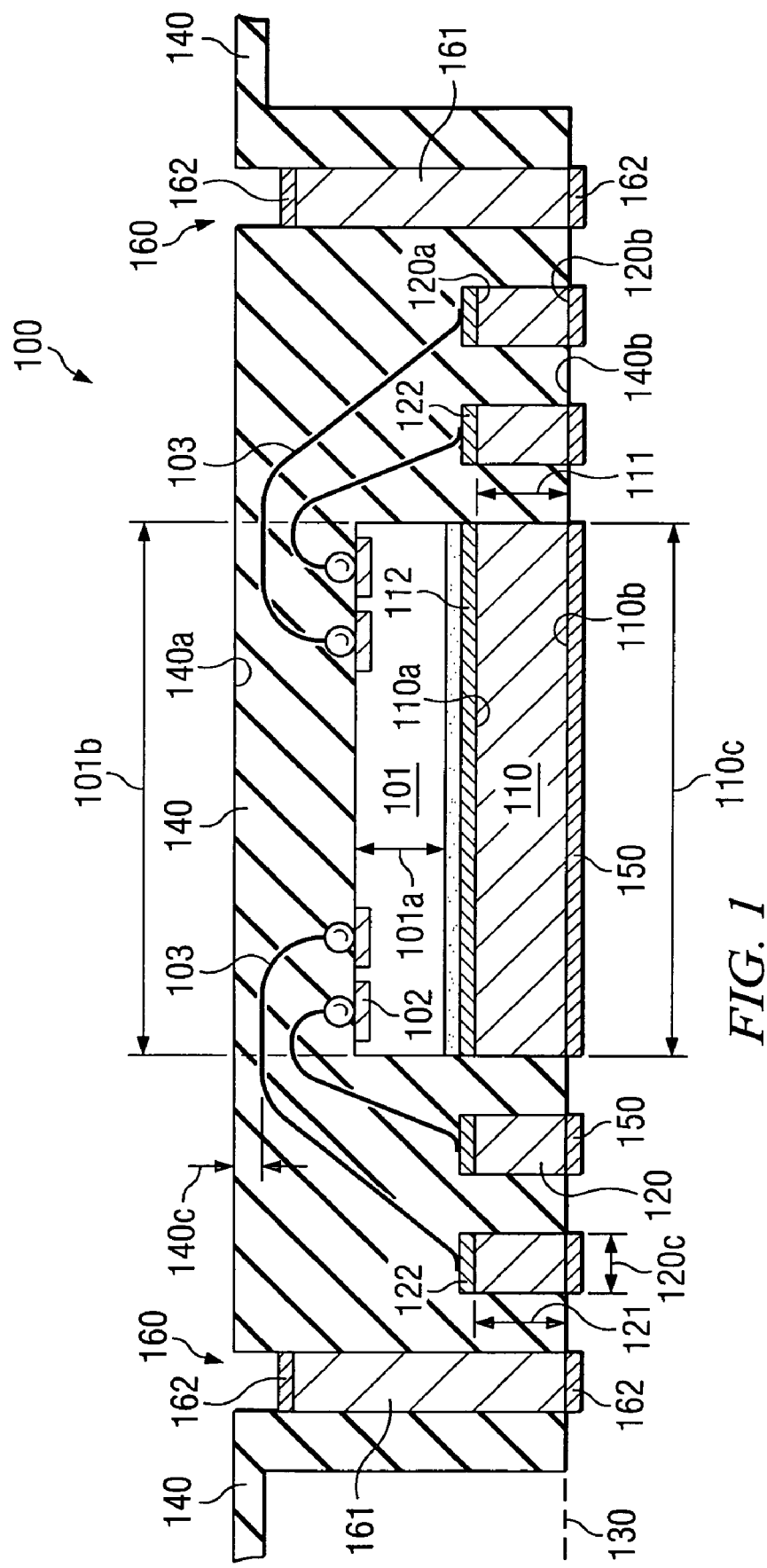
FIG. 1 is a schematic cross section of a finished QuadFlat-Pack no-Lead (QFN) device designed and fabricated according to the methodology of the invention.

FIG. 1 shows a semiconductor device example, a representative of the Quad Flat Pack no-Lead (QFN) family, which has been designed and fabricated by the concepts of the invention. The device is generally designated 100. In the device is a semiconductor chip 101, which has a thickness 101a, a length 101b, a width (not shown in FIG. 1), and a plurality of bond pads 102. The market offers a wide selection of chip sizes 101 for QFN devices; a typical example is a chip of 2.4 mm by 1.65 mm; other chips may be smaller or much larger. The size and number of bond pads 102 also varies widely; the number, for instance, from 8 to 44. As an example, the chip just quoted has 10 bond pads, each pad the size 0.275 mm by 0.35 mm. The chip thickness 101a also varies considerably; in some devices, the thickness is 275 µm, in other devices only 100 µm.

In the device is further a first cuboid 110 made of metal. A preferred choice of metal is copper or a copper alloy; alternative choices are iron-nickel alloy (covar), or other metals. The preferred shape of cuboid 110 is a rectangular parallelepiped, but rounded or circular structures are also possible. Cuboid 110 has a first surface 110a and a second surface 110b, which preferably have a length 110c and a width (not shown in FIG. 1) approximately equal to the length 101b and width, respectively, of the chip. Cuboid 110 further has sides (usually four sides, not shown in FIG. 1 since the Fig. is a cross section); the sides have a height 111. On the first surface 110a of the first cuboid is a thin silver layer 112.

The device in FIG. 1 further has a plurality of second metallic cuboids 120. They are made of the same metal as first cuboid 110, preferably copper or a copper alloy. The number of cuboids 120 depends on the number of bond pads of chip 101. They may be arranged in a single row around the chip perimeter, or in multi-rows. The example illustrated in FIG. 1 has double rows. The second cuboids 120 have first surfaces 120a and second surfaces 120b. The length 120c and width (not shown in FIG. 1) of the surfaces are suitable for wire bond attachment. Further, the second cuboids have sides (usually four sides, not shown in FIG. 1 since the Fig. is a cross section); the sides have a height 121, which is substantially equal to the height 111 of the first cuboid 110. On the first surface 120a of the second cuboids is a thin silver layer 122.

Adhesive attach material 103 (preferably an epoxy or polyimide compound) attaches chip 101 to the silver layer 112 on the first surface 110a of the first cuboid 110. The bond pads 102 of the chip are connected by bonding wires 103 (preferably gold) to the silver layers 122 on the first surfaces 120a of the second cuboids 120, respectively.

As FIG. 1 shows, the second surfaces 110b and 120b of the first cuboid 110 and the second cuboids 120, respectively, are aligned in a plane 130.

FIG. 1 illustrates that encapsulation compound 140 is embedding the chip 101, the bonding wires 103, and the sides of all cuboids. Preferably, compound 140 is a molding compound selected to adhere strongly to chip, bonding wires and cuboid sides; preferred material choices include thermoset epoxies filled with alumina or silica fillers. Compound 140 forms a first surface 140a above the embedded wires 103; surface 140a is selected so that the distance 140c between the surface and the wire spans is safely covering and protecting the span highest above the chip.

The second surface 140b of the encapsulation compound is aligned with plane 130 of the second cuboid surfaces.

Protruding from plane 130 are stacks 150 of layers consisting of nickel, palladium, and optional gold, with the gold being the outermost layer. These stacks are on the second surfaces 110b and 120b of the first and second cuboids, respectively, and give these surfaces a metallurgical configuration suitable for metal reflow attachment (preferably tin-based solders) to external parts. Specifically, the second surface 110b of the first cuboid may be attached to an external heat sink, and the second surfaces 120b of the second cuboids may be attached to electrical pads of substrates or circuit boards.

As FIG. 1 shows, device 100 may have a plurality of vias 160 through the encapsulation compound 140 from the first compound surface 140a to the second compound surface 140b. The locations of the vias are selected to enable stacking of devices such as device 100. Actually, the vias are filled with two kinds of metal: The major portion 161 is made of the same copper-containing metal as the cuboids; preferably, portion 161 is copper or a copper alloy. Dependent on the thickness of chip 101 and the height of the wire spans, the height of portion 161 is between about 0.50 and 0.75 mm. The surfaces of both via ends have a metallurgical configuration 162 suitable for metal reflow attachment in stacking of devices, preferably a stack of nickel and palladium layers with an optional gold layer as the outermost layer.

Another embodiment of the invention is a stacked semiconductor device. A first device as described above and in FIG. 1 is provided; this first device has a plurality of metal-filled vias in locations selected for stacking of devices. Then, a plurality of reflow elements of about equal size is provided, for example solder balls. One of the reflow elements each is attached to the solderable surface 162 of each via metal. It is a technical advantage in the reflow process of the solder elements that the via is recessed relative to the top device surface 140a; the encapsulation compound 140 acts as a solder mask and supports the solder joint against thermo-mechanical stress.

A second device is provided, which has a plurality of metal-filled vias in the same locations as the vias of the first device. The second device is aligned with the first device so that the second device vias are aligned with the matching first device vias. The matched second device vias also then attached to the reflow elements attached to the first device vias.

The device metals at the plane 130 (see FIG. 1), which have the metal layers 150 to be metallurgically suitable for reflow attachment, can easily be attached to a circuit board. As an example, the first copper cuboid 110 may be attached to a heat sink and the second copper cuboids 120 to electrical board pads.

Figure 2:
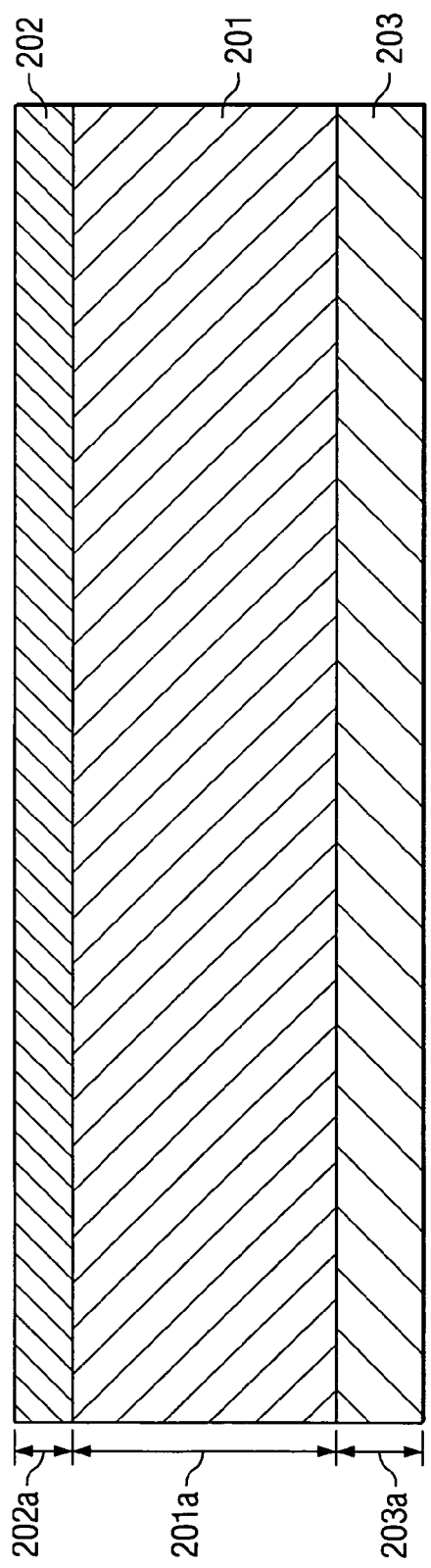

Another embodiment of the invention is a method for fabricating a semiconductor device. Certain process steps are schematically indicated in the cross sections of FIGS. 2 through 9. FIG. 2 depicts the starting material, a sheet of metal containing a core sheet 201 of copper or copper alloy with a thickness 201a, clad with an aluminum layer 202 on the top surface of the copper sheet, and further clad with an aluminum layer 203 on the bottom surface of the copper sheet. The thickness of the copper core sheet is referred to as the first thickness. For many devices, a preferred range of first copper thickness 201a is between about 0.50 and 0.75 mm. The aluminum layers 202 and 203 also have a thickness 202a and 203a, respectively; for some devices such as in FIG. 2, the thicknesses are the same for both layers, but for other devices they may be different. A preferred thickness range for 202a is between 0.125 and 0.375 mm. Index holes may be punched in the starting material.

In the next process step, a portion is cut from the copper core sheet 201, clad with the supporting layers 202 and 203; the portion has the x-y dimensions of the intended device.

Photoresist is applied to the top aluminum layer. A photomask is used to define those locations, which are determined to evolve into the metal-filled vias of the finished device and where thus the photoresist has to be retained; in all other areas, the photoresist is removed and the aluminum is exposed. Next, the unprotected top aluminum is etched using a caustic etchant (NaOH or KOH) and removed so that the copper of the core sheet is exposed.

Figure 3:
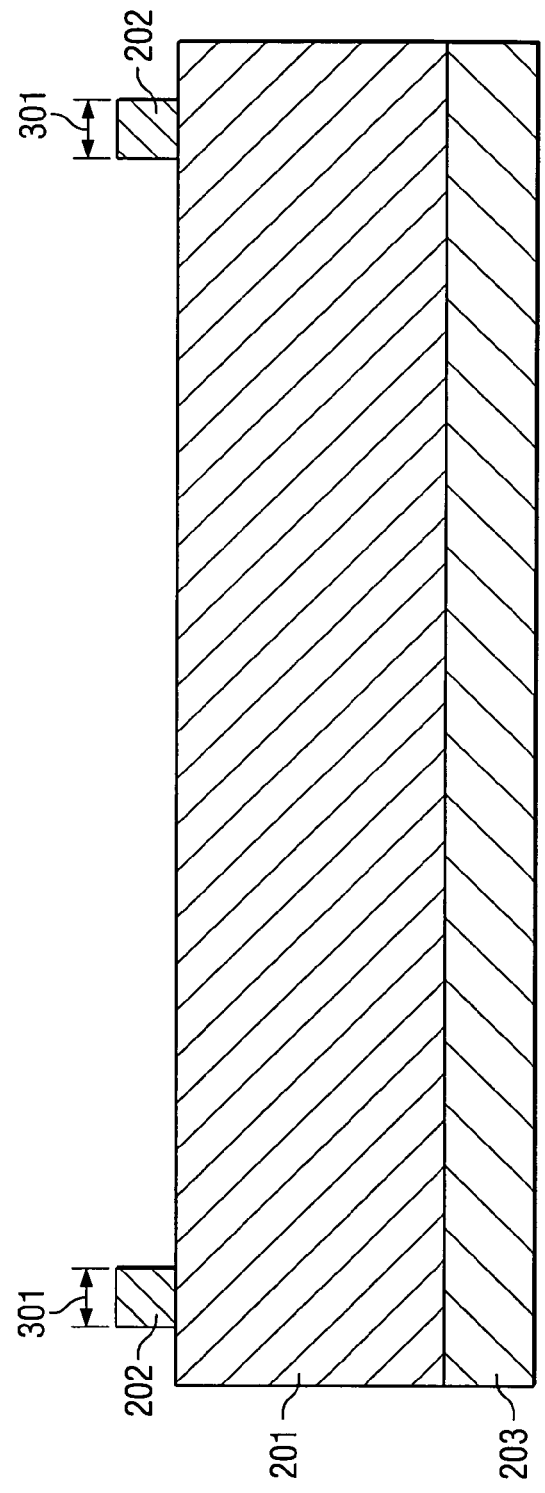

This stage of the process is illustrated in FIG. 3. The retained aluminum 202 has a lateral dimension 301; between these locations, the core copper 201 is exposed.

Figure 4:
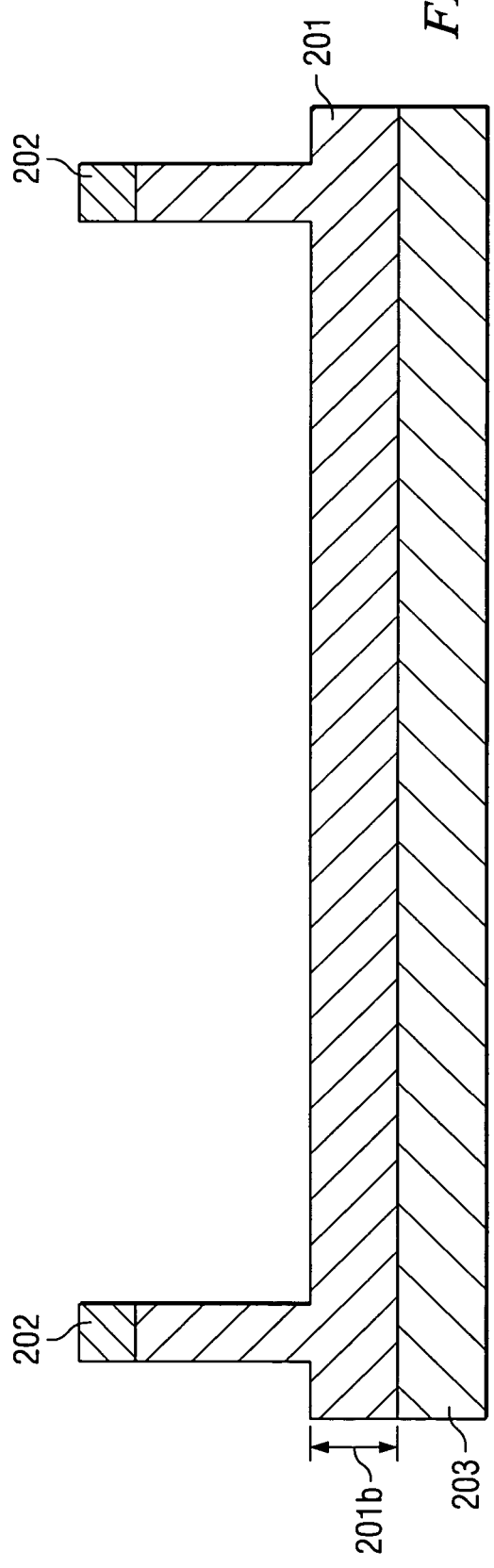
Figure 5:
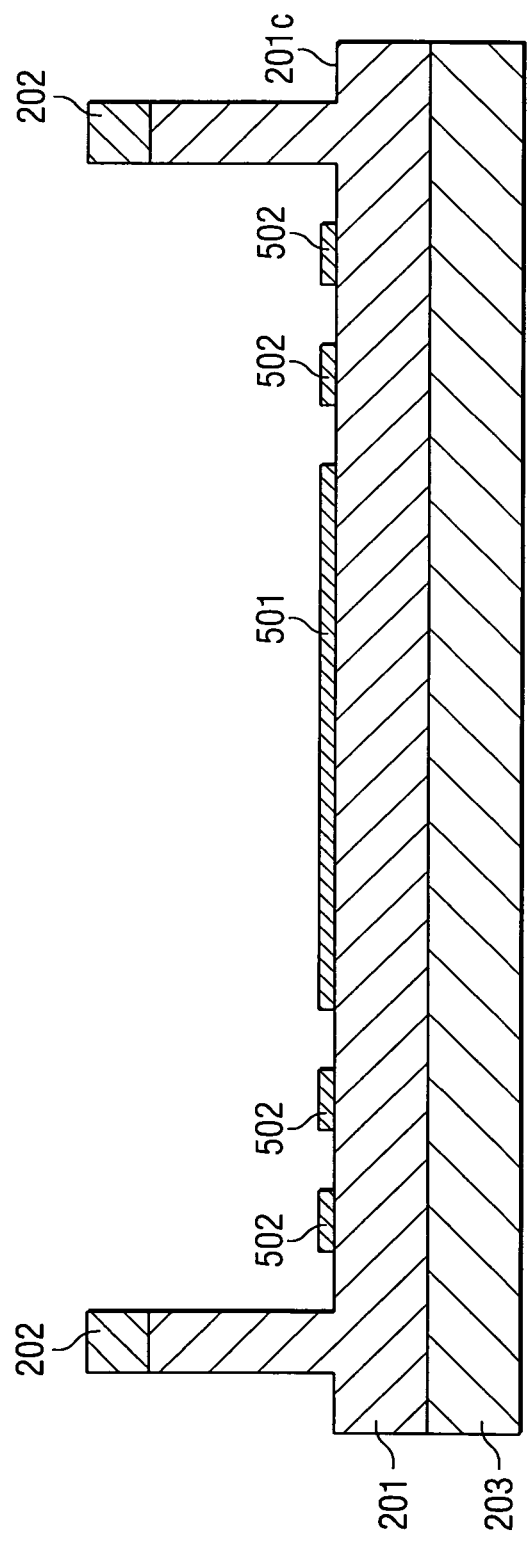

In the next process step, depicted in FIG. 4, the exposed copper of core sheet 201 is etched, typically by ferric chloride (FeCl$_3$) or cupric chloride (CUCl$_3$). The etching is controlled and continues until a pre-determined second thickness 201b of the copper is reached. Second thickness 201b will be the height of the future copper cuboids of the device.

A thin layer of silver is selectively plated on the new copper surface 201c to define the areas, which are intended for attaching the semiconductor chip (silver area 501) and for serving as stitch locations of the wire bonds (silver areas 502). It is well known that gold wires bond strongly and reliably to silver spots. Preferably, the chip attach area 501 is selected to have substantially the same dimensions as the chip-to-be-attached. The bond stitch areas 502 are preferably only 30 to 60 μm squared, enough to accommodate the gold wire stitch.

As FIG. 6 shows, in the next process step the copper not protected by the silver areas 501 and 502 (and the top aluminum 202) is etched and removed, until the bottom aluminum layer 203 is reached. After this process step, the copper cuboids 601 and 602 of the device have been created. The cuboids have sides of the height 201b of the second copper thickness. The cuboids further have a first surface 601a and 602a, respectively, covered by the silver layer 501 and 502, respectively, and a second surface 601b and 602b, respectively, clad by the aluminum layer 203.

A semiconductor chip 701 is provided, which has a plurality of bond pads 702 (see FIG. 7). Chip 701 is attached to the silver-plated (501) cuboid 601, which has been prepared with the correct length and width for the x-y dimensions of the chip. Standard adhesive 703 (epoxy or polyimide) is used for the attachment. Thereafter, the chip band pads 702 are connected with the respective silver-plated bond cuboids 602 using standard bonding wires 704 (diameter typically 20 to 25 μm). To keep the looping of the wires low, the gold of the bonding wires is preferably alloyed with a metal such as copper for hardening.

Before the step of embedding the cuboid sides in encapsulation compound, it is preferred to activate all copper cuboid sides in order to enhance the adhesion to encapsulation compound. A cost-effective and reliable method of activation consists of controlled oxidation of the copper by exposure to sodium hydrochloride.

Figure 8:
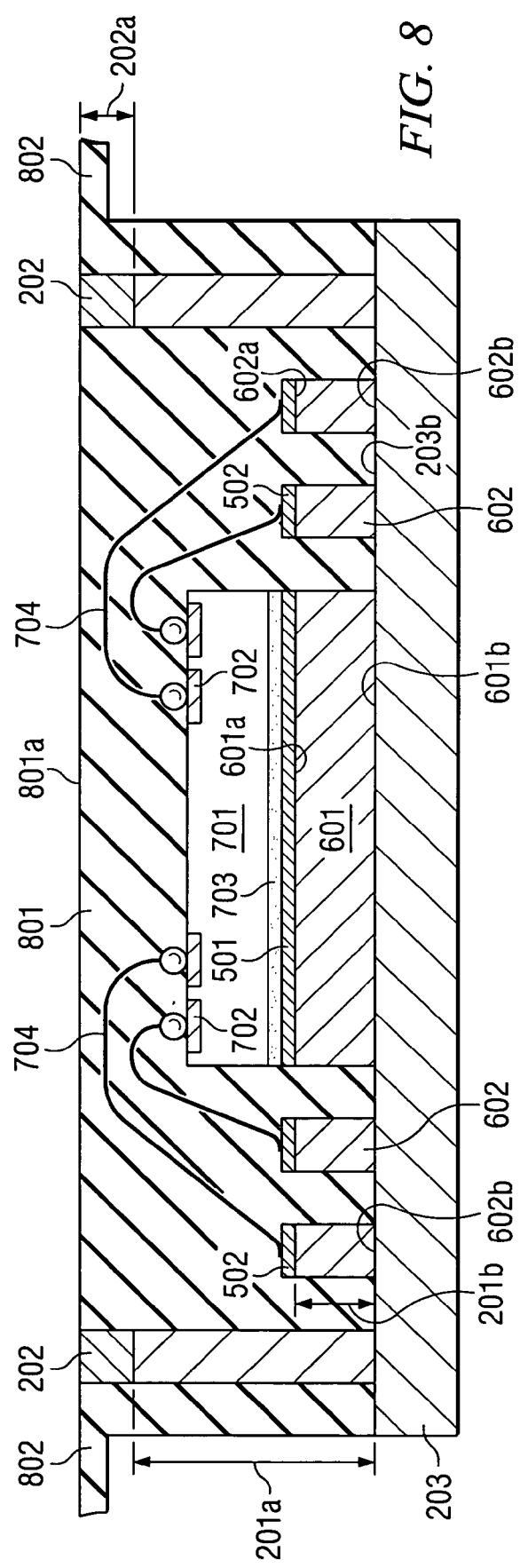

In FIG. 8, encapsulation material 801 is used to embed chip 701, the wire bonds 704 and all cuboid sides of height 201b, of cuboid 601 and all cuboids 602. Preferably, a thermoset molding compound (with alumina- or silica-filled epoxies) with strong adhesive characteristics is employed. The encapsulation material fills the device from the surface 203b of the clad aluminum layer 203 up to the level 801a of the first copper thickness 201a plus the aluminum layer thickness 202a, the total height of the metal-filled via. The level 801a of the encapsulation compound thus created is to become the top surface of the finished device.

Concurrent with the step of embedding, one or more plastic tabs 802 are formed; consequently, they are also formed by the same molding compound as the embedded device. Tabs 802 serve to connect the individual embedded devices to each other for mechanical support; they can be broken easily, when the devices have to be singulated.

Figure 9:
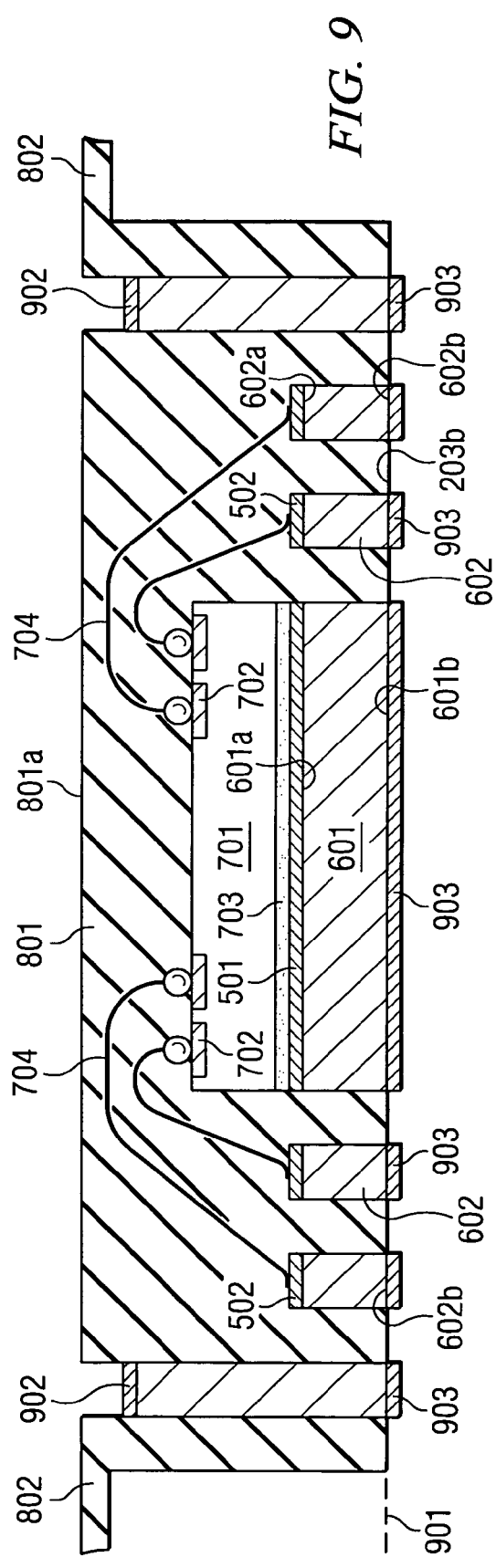

In the next process step, illustrated in FIG. 9, the bottom aluminum layer 203 and the remnants of top aluminum layer 202 are removed by etching using a caustic etchant. By this action, the bottom surface 901 of the finished device is created. It consists of the aligned second surfaces 601b and 602b of the copper cuboids 601 and 602, respectively, and the surface 203b towards the former clad aluminum layer 203.

FIG. 9 further includes the preferred process step of depositing solderable metal layers of all exposed metal surfaces of the top and bottom device surfaces. In FIG. 9, these solderable metal layers are designated 902 on the top device surface, and 903 on the bottom device surface. Preferably, the solderable metal layers consist of a stack of nickel, palladium, and gold layers, with the gold layer the outermost layer.

Reflow elements such as solder balls can easily be attached to the solderable metal layers 902 and 903. The attachment of the finished device of FIG. 9 to another device in a stacking operation and/or to external parts such as circuit boards is thus a reliable process step.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, more than one device can be stacked upon each other as long as the connecting vias have suitable locations. As another example, the vias themselves may become electrically active, for instance by serving as ground potential or power conductors; in these applications, they may be electrically connected to active devices or outside power supplies. It is therefore intended that the appended claims encompass any such modifications.

I claim:

1. A semiconductor device comprising:
   a semiconductor chip having a length and a width, and a plurality of bond pads, affixed to a first metallic cuboid containing copper via a adhesive layer and a separate first layer containing silver, the cuboid having first and second surfaces of length and width approximately equal to the chip's length and width, the cuboid further having sides of a height;

a plurality of second metallic cuboids containing copper, the second cuboids having first and second surfaces of length and width suitable for wire bond attachment, the second cuboids further having sides of a height substantially equal to the height of the first cuboid;

a layer of silver similar to the first layer affixed on the first surfaces of the plurality of second cuboids;

the chip bond pads wire bonded to the silver layer on the first surfaces of the second cuboids, respectively;

the second surfaces of the first and second cuboids aligned in a plane; and encapsulation compound adhering to and embedding the chip, the wire bonds, and the sides of all cuboids so that the compound forms a first surface above the embedded wires and a second surface aligned with the plane of the second cuboid surfaces.

2. The device according to claim 1 further comprising a plurality of vias through the encapsulation compound from the first to the second compound surfaces, the vias filled with metal containing copper, the via locations selected for stacking of devices.

3. The device according to claim 2 wherein the vias have, at the first and second compound surfaces, a metallurgical configuration suitable for metal reflow attachment.

4. The device according to claim 1 wherein the second cuboid surfaces have a metallurgical configuration suitable for metal reflow attachment to external parts.

5. The device according to claim 4 wherein the metallurgical configuration consists of a stack of layers including nickel, palladium, and gold, the gold layer being the outermost layer.

6. A stacked semiconductor device comprising:

a first device as described in claim 5, the first device having a plurality of metal-filled vias in locations selected for stacking of devices;

a plurality of reflow elements of about equal size;

one reflow element attached to each via metal at the first encapsulation compound surface of the first device;

a second device having a plurality of metal-filled vias in the same locations as the vias of the first device;

the second device aligned with the first device so that the second device vias are aligned with the matching first device vias at the first encapsulation compound surface; and the matched second device vias also attached to the reflow elements attached to the first device vias.

7. A method for fabricating a semiconductor device comprising the steps of:

providing a composite sheet having a core sheet of copper, the core sheet having a first thickness, an aluminum layer clad on the top surface, and an aluminum layer clad on the bottom surface;

cutting from the composite sheet a portion having the x-y dimensions of the device-to-be-built;

protecting those locations of the top aluminum layer with photoresist, which are determined to evolve into metal-filled vias;

etching the top aluminum of the unprotected layer portions, exposing the copper of the core sheet;

etching the exposed copper to reach a pre-determined second thickness;

selectively plating silver to define areas intended for chip attach and wire bond;

etching the copper unprotected by the silver areas, until the bottom aluminum layer is reached to create metal cuboids capped by silver, the cuboids having sides of the height of the second thickness;

providing a semiconductor chip having a plurality of bond pads;

attaching the chip to the respective silver-plated cuboid;

connecting the chip bond pads to the respective silver-plated bond cuboids using bonding wire;

embedding the chip, the wire bonds, and the sides of all cuboids in adhesive encapsulation compound up to the level of the first thickness including the aluminum-capped metal vias, thereby creating the top surface of the device; and removing the bottom aluminum layer by etching, thereby creating the bottom surface of the device.

8. The method according to claim 7 further comprising the step of activating the copper cuboid sides for improved adhesion to the encapsulation compound before the step of embedding the cuboid sides in encapsulation compound, the activation comprising controlled oxidation of the copper by exposure to sodium hydrochloride.

9. The method according to claim 7 wherein the encapsulation compound consists of a thermoset molding compound, including epoxy.

10. The method according to claim 9 further comprising the step of molding, concurrent with the step of embedding, one or more plastic tabs to connect the individual embedded devices to each other for mechanical support.

11. The method according to claim 7 further comprising the step of depositing solderable metal layers on all exposed metal surfaces.

12. The method according to claim 11 wherein the solderable metal layers consist of a stack of nickel, palladium, and gold layers, with the gold layer the outermost layer.

13. A method for fabricating a semiconductor device comprising the steps of:

masking a hard-mask layer on a copper sheet with a photoresist pattern;

etching the hard-mask layer unprotected by the photoresist pattern, exposing the copper sheet;

etching the exposed copper to a first thickness;

selectively plating a layer of silver on the exposed copper;

etching the copper unprotected by the silver layer or the hard-mask pattern to create metal cuboids capped by selectively plated silver and metal cuboids capped by the hard-mask pattern; and attaching a semiconductor chip to a silver-plated cuboid.

14. The method according to claim 13 further comprising the step of oxidizing the copper cuboids.

15. The method according to claim 14 further comprising a step of encapsulating the chip and the copper cuboids with a thermoset molding compound, including epoxy.

16. The method according to claim 13, in which the attaching step further comprising using an epoxy or a polyimide.

17. The method according to claim 13 further comprising affixing the copper sheet on a supporting layer.

18. The method according to claim 17 wherein the supporting layer comprises aluminum.

19. The method according to claim 18, further comprising removing the supporting layer.

20. The method according to claim 13, in which the hard mask comprises aluminum.

* * * * *